United States Patent [19]

Orbach

[11] Patent Number: 4,924,287
[45] Date of Patent: May 8, 1990

[54] PERSONALIZABLE CMOS GATE ARRAY DEVICE AND TECHNIQUE

[75] Inventor: Zvi Orbach, Haifa, Israel

[73] Assignee: Avner Pdahtzur, Haifa, Israel

[21] Appl. No.: 449,063

[22] Filed: Dec. 18, 1989

Related U.S. Application Data

[63] Continuation of Ser. No. 311,397, Feb. 16, 1989, abandoned, and a continuation of Ser. No. 273,706, Nov. 15, 1988, abandoned, which is a continuation of Ser. No. 819,707, Jan. 17, 1986, abandoned.

[30] Foreign Application Priority Data

Jan. 20, 1985 [IL] Israel ............................. 74108

[51] Int. Cl.⁵ ..................... H01L 27/02; H01L 21/10
[52] U.S. Cl. ........................................ 357/51; 357/40; 357/42; 357/45
[58] Field of Search ................. 357/40, 42, 45, 51

[56] References Cited

U.S. PATENT DOCUMENTS

| | | |
|---|---|---|
| 3,731,375 | 5/1973 | Agusta et al. . |
| 3,740,523 | 6/1973 | Cohen et al. . |
| 3,769,108 | 10/1973 | Feldman et al. . |
| 4,045,310 | 8/1977 | Jones et al. ........................ 357/51 |
| 4,124,889 | 11/1978 | Birk et al. ......................... 357/51 |
| 4,124,899 | 11/1978 | Birkner et al. . |
| 4,197,555 | 4/1980 | Uehara et al. . |
| 4,217,393 | 8/1980 | Staebler et al. . |
| 4,233,671 | 11/1980 | Gerzberg et al. . |
| 4,238,839 | 12/1980 | Redfern et al. . |
| 4,240,094 | 12/1980 | Mader . |
| 4,259,367 | 3/1981 | Dougherty, Jr. . |
| 4,289,846 | 9/1981 | Parks . |
| 4,308,090 | 12/1981 | Te Velde et al. . |
| 4,321,104 | 3/1982 | Hasegawa et al. . |
| 4,325,181 | 4/1982 | Yoder . |
| 4,356,504 | 10/1982 | Vozan ............................... 357/42 |
| 4,387,503 | 6/1983 | Aswell et al. . |
| 4,389,429 | 6/1983 | Soclof . |
| 4,412,237 | 10/1983 | Matsumura et al. .............. 357/42 |
| 4,450,041 | 5/1984 | Aklufi . |
| 4,455,194 | 6/1984 | Yabu et al. . |
| 4,455,495 | 6/1984 | Masuhara et al. . |
| 4,476,478 | 10/1984 | Noguchi et al. . |
| 4,520,554 | 6/1985 | Fisher . |
| 4,536,249 | 8/1985 | Rhodes . |
| 4,536,949 | 8/1985 | Takayama et al. . |
| 4,561,906 | 12/1985 | Calder et al. . |
| 4,581,628 | 7/1986 | Miyauohi et al. ................ 357/84 |

(List continued on next page.)

FOREIGN PATENT DOCUMENTS

| | | |
|---|---|---|
| 0089814 | 9/1983 | European Pat. Off. . |
| 0111128A2 | 7/1984 | European Pat. Off. . |
| 0210397 | 6/1987 | European Pat. Off. . |
| 61678 | 12/1980 | Israel . |
| 58-85550A | of 0000 | Japan . |
| 57-89476 | 12/1982 | Japan . |
| 58-157 | 1/1983 | Japan . |
| 58-60560 | 4/1983 | Japan . |
| 61-194740A | 8/1986 | Japan . |
| 2170649 | 8/1986 | United Kingdom . |

OTHER PUBLICATIONS

IBM Technical Disclosure Bulletin, Wet Etching for Line Deletion . . . , vol. 27, Mar. 1985, pp. 5764–5765.
D. Bursky, Semiconductor Technology, Electronic Design, No. 12, Jun. 1984, pp. 108–122.
Garrison et al, Laser Ablation of Organic Polymers, Journal of Applied Physics, No. 8, Apr. 1985, pp. 2909–2914.
M. J. Bowden, Forefront of Research on Resists, Solid State Technology, Jun. 1981, pp. 73–87.

(List continued on next page.)

*Primary Examiner*—J. Carroll
*Attorney, Agent, or Firm*—Finnegan, Henderson, Farabow, Garrett and Dunner

[57] ABSTRACT

An integrated circuit device comprising a collection of semiconductor elements and fusible links interconnecting the collection of semiconductor elements, whereby selective fusing of the fusible links defines the electronic function provided by the collection of semiconductor elements. Such semiconductor elements are typically transistors.

17 Claims, 6 Drawing Sheets

U.S. PATENT DOCUMENTS

| | | |
|---|---|---|
| 4,585,490 | 4/1986 | Raffel et al. . |
| 4,590,589 | 5/1986 | Gerzberg . |
| 4,601,778 | 7/1986 | Robb . |
| 4,602,420 | 7/1986 | Saito . |
| 4,628,590 | 12/1986 | Udo et al. . |
| 4,632,725 | 12/1986 | Hartmann et al. . |
| 4,636,404 | 1/1987 | Raffel et al. . |
| 4,651,190 | 3/1987 | Suzuki et al. ................. 357/42 |
| 4,665,295 | 5/1987 | McDavid . |
| 4,691,434 | 9/1987 | Percival et al. . |
| 4,692,786 | 0/1983 | Lindenfelser . |
| 4,717,689 | 1/1988 | Maas et al. . |
| 4,718,977 | 1/1988 | Contiero et al. . |
| 4,720,470 | 1/1988 | Johnson ..................... 437/173 |
| 4,720,908 | 1/1988 | Wills . |
| 4,740,485 | 4/1988 | Sharpe-Geisler . |
| 4,751,197 | 6/1988 | Wills . |
| 4,758,745 | 7/1988 | Elgamal et al. . |
| 4,783,424 | 11/1988 | Ohno et al. . |
| 4,800,179 | 1/1989 | Mukai . |

OTHER PUBLICATIONS

I. Adesida, Ion Bombardment of Resists, Nuclear Instruments in Physics Research, vols. 209/210, May 1983, Part 1, pp. 79-86.
T. McGrath, Applications of Eximer Lasers in Microelectrics, Solid State Technology, No. 12, Dec. 1983, pp. 165-169.
J. J. Gadja et al, IBM Disclosure Bulletin, vol. 21, No. 12, May, 1979, Selective Conversion of Films . . . , pp. 4848-4851.
C. Fiori et al, High Resolution Ultraviolet Photoablation of SiOx Films, Applied Physics Letters, Aug. 1985, No. 4, pp. 361-362.
D. B. Tuckerman et al, Laser Planarization, Solid State Technology, Apr. 1986.
D. Smart, Optimization of Semiconductor Layer Thicknesses for Repair of RAMs, Application Report 150.
B. C. Cole, Laser Micromachining Brings Quick Prototypes, Electronics, Nov. 12, 1987, pp. 72-74.
P. Martin et al, Observation of Exceptional Temperature Humidity Stability . . . , Applied Optics, vol. 23, No. 9, May, 1984, pp. 1307-1308.
S. K. Ghandi, VLSI Fabrication Principles, A Wiley Interscience Publication, pp. 542-548 (1983).

D. Platteter, Basic Integrated Circuit Failure Analysis Techniques, pp. 248-254.
J. Melngailis et al, The Focused Ion Beam as an Integrated . . . , J. Vac. Sci. Technol. B. vol. 4, No. 1, Jan.-/Feb., 1988.
J. Logue, et al, Techniques for Improving Engineering Productivity . . . IBM J. Res. Develop., vol. 25, No. 3, May 1981.
J. I. Raffel et al, Laser-Formed Connections Using Polyimide (Dec. 1983).
J. A. Yasaitis et al, Low Resistance Laser Formed Lateral Links, 1982, IEEE, p. 184.
J. I. Raffel et al, A Demonstration of Very Large Area . . . , 1983, IEEE, pp. 781-783.
J. C. North et al, Laser Coding of Bipolar Read-Only Memories, IEEE Journal of Solid State Circuits, Aug. 1976, pp. 500-505.
J. C. North, Laser Vaporization of Metal Films . . . , J. of Applied Physics, vol. 48, No. 6, Jun. 1977, pp. 2419-2423.
J. I. Raffel et al, A Wafer-Scale Digital Integrator . . . , IEEE J. of Solid-State Circuits, vol. SC-20, No. 1, Feb., 1985, pp. 399-406.
S. Wolf et al, Silicon Processing for the VLSI Era, vol. 1, Process Technology, pp. 438-441 (1982).
M. Briska et al, Production and Application of Polysilicon Masks, IBM Technical Disclosure Bulletin, vol. 23, No. 1, Jun. 1980, pp. 199-200.
J. I. Raffel et al, Laser Programmed VIAS for Restructurable VLSI, International Electron Devices Meeting, Dec., 1980.
Model 8000, Laser Programming System: The High Yield Solution (Jan. 1984), pp. 1-16.
Florod Lasers for Microelectronics, Advancing Laser Technology (Oct. 1984), pp. 1-19, 112.
Computer Design, Mar. 1984, pp. 166, 14, 216.
R. L. Waters et al, A Laser Cutter for Failure Analysis (1983), Proceedings of International Symposium for Testing & Failure Analysis.
S. Kazmi et al, CMOS Gate-Array Circuits . . . , EDN Oct. 31, 1984, pp. 173-180.
Technology Report, Laser Focus/Electro-Optics, Apr. 1984, "Laser Writing Produces Working ICs", pp. 14-15.

(List continued on next page.)

OTHER PUBLICATIONS

McWilliams et al, Appl. Phys. Lett. 43(10), Nov. 1983, pp. 946-947.

Industry News, Semiconductor International, Nov. 1983, p. 20.

Industry News, Semiconductor International, p. 119 (Feb. 1984).

J. I. Raffel et al., "A Demonstration of Very Large Area Integration Using Laser Restructuring", Proc. IEEE Int. Symp., Circuits and Systems, pp. 781-783, 1983.

J. C. Logue et al., "Techniques for Improving Engineering Productivity of VLSI Designs," IBM J. Res. Dev., vol. 25 (3) 5, 1981.

Raffel, J. I., Anderson, A. H., Chapman, G. H., Kankle, K. H., Mathur, B., Soares, A. M. & Wyatt, P. W. A., "Wafer-Scale Digital Integrator Using Restructurable VLSI", *IEEE Journal of Solid State Circuits,* vol. Sc. 20, No. 1 (Feb. 1985), pp. 399-406.

Smart, D., "Optimization of Semiconductor Layer Thicknesses for Repair of RAMS", Application Report 150, Teradyne, Inc., Boston, Mass.

North, J. C. Laser Vaporization of Metal Films-Effect of Optical Interference in Underlying Dielectric Layers, *J. Applied Physics,* 48(6), Jun. 1977, pp. 2419-2423.

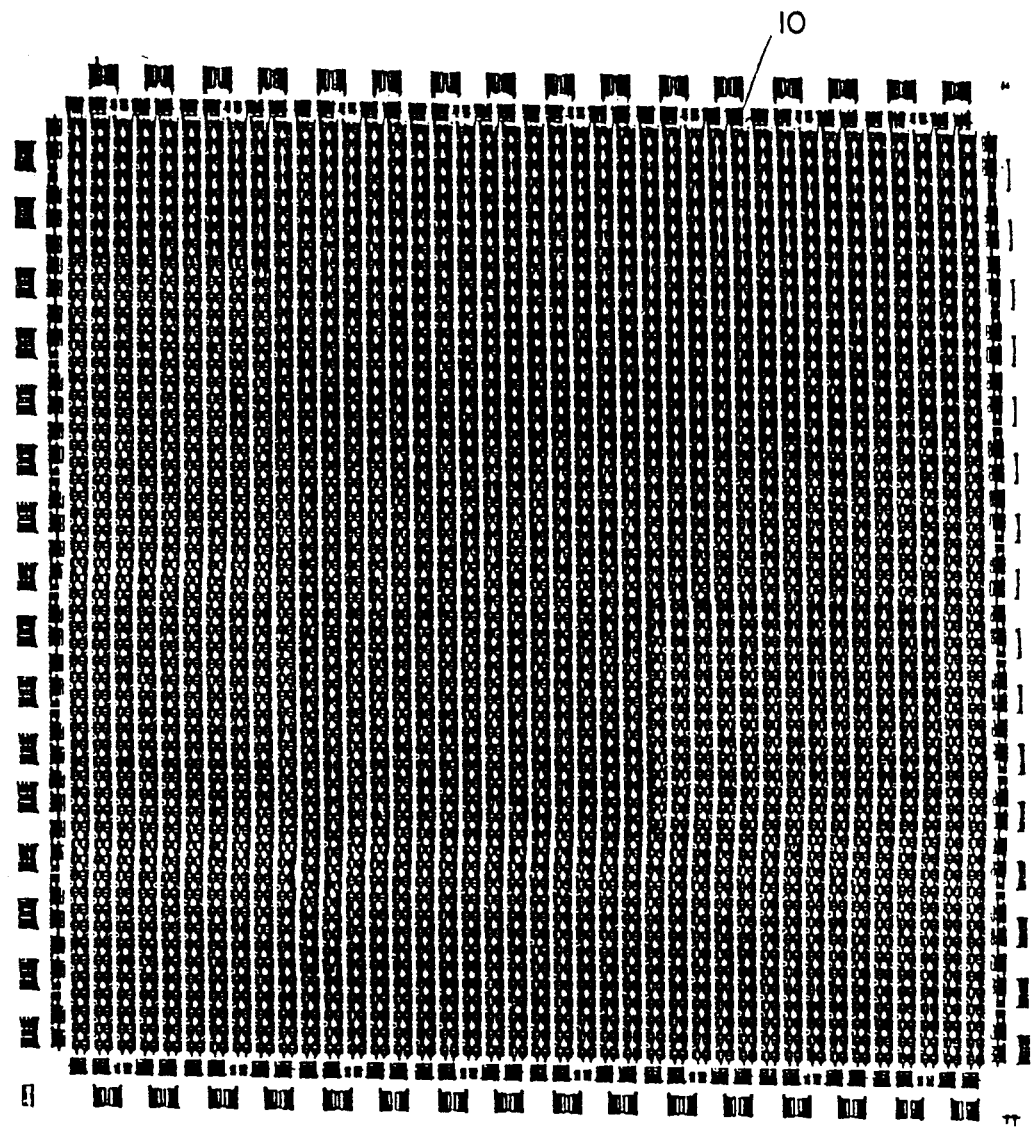
FIG.IA

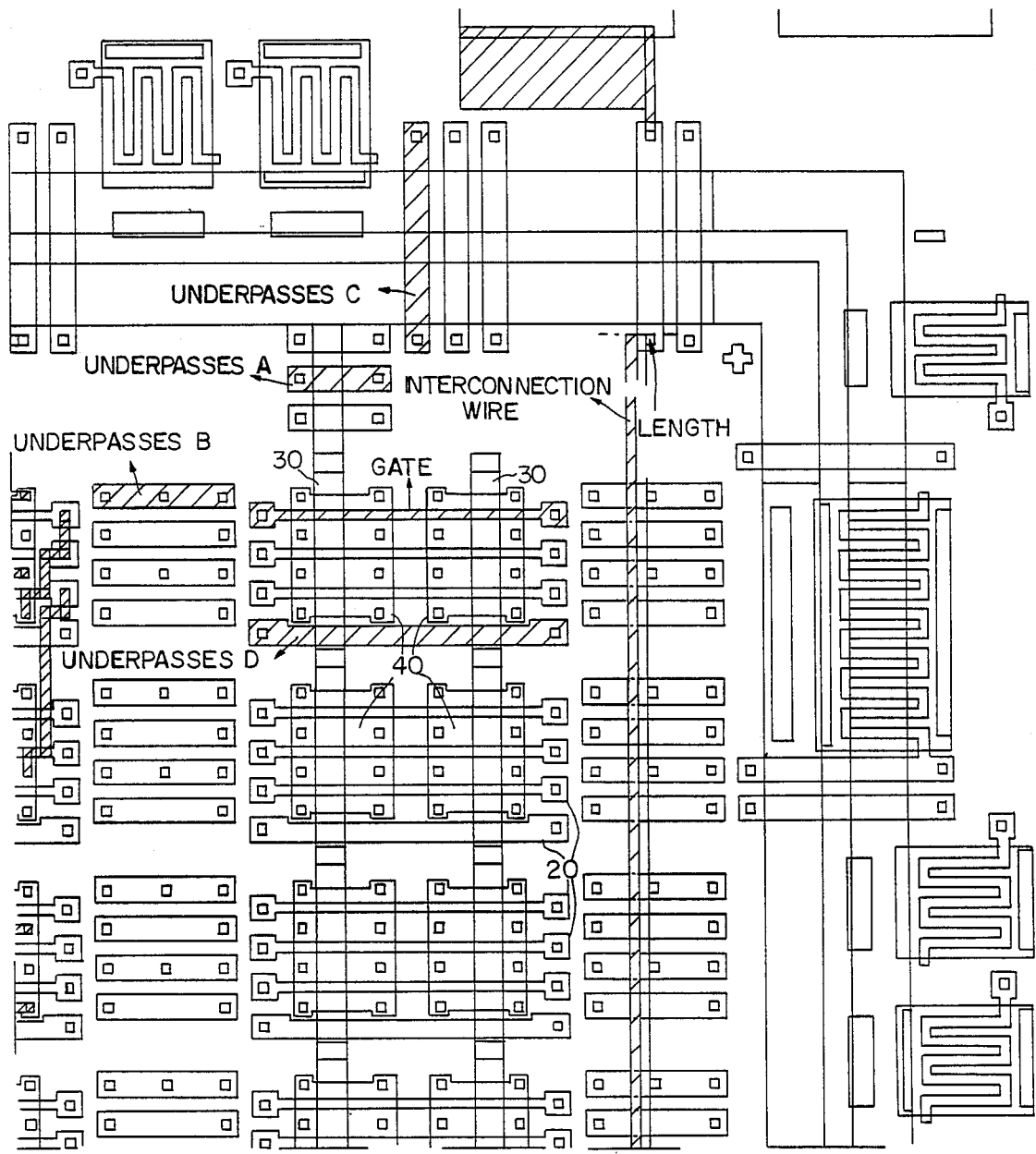
FIG.IB $= \overline{\overline{A+B+\overline{C}} + D}$
$= A+B+\overline{C}+\overline{D}$ $= \overline{\overline{\overline{B}}\,\overline{D}} = BD$ $= \overline{\overline{A+B+\overline{C}} + D} = (A+B+\overline{C}) \cdot \overline{1}$

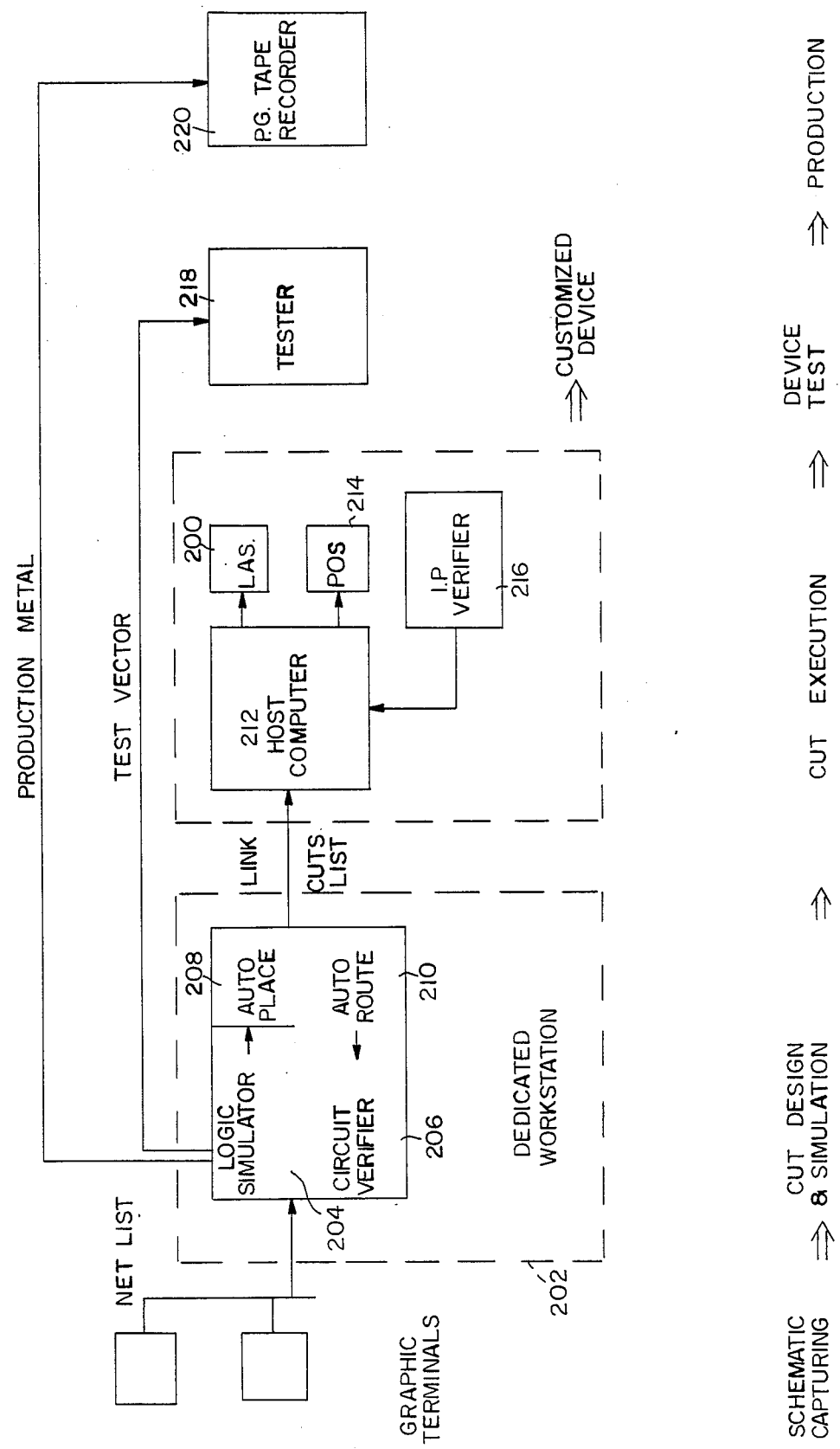

PERSONALIZABLE CMOS GATE ARRAY DEVICE AND TECHNIQUE

This application is a continuation of application Ser. No. 07/311,397, filed 2/16/89, and a continuation of application Ser. No. 07/273,706, filed November 15, 1988, abandoned, which is a continuation of application Ser. No. 06/819,707, filed January 17, 1986, abandoned.

FIELD OF THE INVENTION

The present invention relates to semiconductor devices and associated systems generally and more particularly to integrated circuit devices which are user modifiable and to systems empolying same.

BACKGROUND OF THE INVENTION

Integrated circuits are electronic circuits which normally include a very large number of semiconductor elements, such as transistors and diodes, as well as other electronic components in highly compact form on a silicon wafer. The basic principle underlying integrated circuits is that instead of building an electronic circuit out of discrete components such as transistors, diodes, resistors and capacitors, the entire circuit is fabricated on the same piece of silicon in the form of a number of superimposed layers of conducting, insulating and transistor forming materials. By arranging predetermined geometric shapes in each of these layers, a circuit having a required function is realized.

The process by which an integrated circuit is fabricated is long and complex and basically includes the following steps:

1. A polished silicon wafer is exposed to an appropriate material in a high temperature furnace in order to "grow" a uniform layer of the material on its surface.

2. After the wafer is cooled, it is coated with a thin film of resist material, which is dried and baked.

3. At the same time, a mask for the appropriate layer is created, which defines the precise pattern required on the silicon surface.

4. This mask is brought firmly into proximity with the coated wafer and exposed to intense ionizing radiation such as ultraviolet light or low-energy x-rays. In areas wherein the mask is transparent to such radiation, the ionizing radiation passes into the resist and breaks down its molecular structure. The portions of the resist that are covered by opaque portions of the mask are not affected.

5. The resist is then developed by immersing the silicon wafer in a solvent which dissolves the resist only at the locations which were exposed to the ionizing radiation.

6. The wafer is then exposed to an appropriate etching material which is effective to remove the material grown previously thereon (Step 1), except where the material is covered by resist, thus defining a desired pattern of the grown material.

7. The remaining resist material is then removed.

The above process is repeated for each of the layers of material forming the integrated circuit. In most integrated circuit technology one or more layers of metal are employed for internal connections on the integrated circuit. These metal layers are usually formed last.

As can be readily appreciated, the above process requires sophisticated machinery and custom masks which must be specially set up for each specific type of custom integrated circuit to be fabricated. For the process to be at all economical, extremely large quantities of integrated circuits must be produced for a given set up. Since there exist applications wherein the quantities desired of a specific circuit are not extremely large, techniques have been developed for producing integrated circuits known as gate arrays. In these gate arrays, a large amount of transistors and other components are produced by the above-described mass production techniques. Specific interconnections therebetween suitable for a specific circuit are then formed on the chip by etching a suitable metal layer thereon. There exist advanced gate-arrays wherein two or more layers of custom metal interconnections may be custom etched.

Despite the use of sophisticated computer aided design and semi-custom devices, the widespread use of dedicated nonstandard integrated circuits is still limited because of the high costs and long lead time involved in their fabrication. Many users of integrated circuits still make extensive use of standard, "off the shelf" available small scale and medium scale integrated circuits.

Electronic circuits manufactured by combining a large number of such standard integrated circuits have a number of disadvantages:

a. A large number of printed circuit boards are required, resulting in an expensive product, relatively long assembly time, relative difficulty in maintenance and troubleshooting and large size.

b. Lower electrical power efficiency is realized. As a result, relatively larger power sources are required and heavier and larger products result.

There are known integrated circuits such as EPROMS and PALS (programmable array logic) which are programmed by fusing which is accomplished electrically via the integrated circuit's input/output pins, requiring elaborate extra fusing circuitry for this purpose.

There are also known techniques for increasing yield of integrated circuits by excising inoperative portions thereof by fusing. This is normally done on wafers including a multiplicity of integrated circuits.

SUMMARY OF THE INVENTION

The present invention seeks to provide an integrated circuit which is readily customized by the user to his specific requirements and is thus suitable for prototype and small scale production.

There is thus provided in accordance with a preferred embodiment of the present invention an integrated circuit device comprising a collection of semiconductor elements and fusible links interconnecting the collection of semiconductor elements, whereby selective fusing of the fusible links defines the electronic function provided by the collection of semiconductor elements. Such semiconductor elements are typically transistors.

Further in accordance with an embodiment of the present invention, the fusible links may comprise a first plurality of connection links operative to provide a plurality of connections between individual semiconductor elements to define functional groupings thereof and a second plurality of connection links operative to provide a plurality of connections between functional groupings.

The functional groupings may define individual cells or collections thereof. The term "cell" includes gates, flip-flops, registers, operational amplifiers, analog switches and other such elements.

Additionally in accordance with an embodiment of the invention, both the first and second pluralities of connection links are fusible for defining the function of the integrated circuit.

Further in accordance with an embodiment of the present invention, the fusible links are arranged so as to be fusible by operation directly thereon by a fusing element external thereto.

Additionally in accordance with an embodiment of the present invention, the integrated circuit device may be constructed such that the fusible links interconnect the collection of semi-conductor elements in a plurality of alternative arrangements.

Further in accordance with an embodiment of the present invention, there is provided an integrated circuit device comprising a collection of cells and a plurality of connection links operative to provide a plurality of connections between individual cells to define functional groupings thereof, wherein the fusible links are characterized in that they are not provided with electrical connections permitting fusing thereof by means of electrical current supplied through the input/output pins of the integrated circuit.

Additionally in accordance with an embodiment of the present invention there is provided apparatus for customizing an integrated circuit of the type described hereinabove including apparatus for receiving an integrated circuit to be customized, apparatus for scanning the surface of the integrated circuit for locating fusible links which it is desired to fuse, fusing apparatus adapted for direct engagement with the fusible links for fusing thereof and apparatus for causing the fusing apparatus to engage selected fusible links on the surface of the integrated circuit in accordance with received programmed information.

Further in according with an embodiment of the present invention, there is also provided a method for customizing mass produced uniform integrated circuits comprising the steps of:

providing a mass produced integrated circuit comprising a collection of semiconductor elements and fusible links interconnecting them;

selectively fusing some of the fusible links to define a desired electronic function to be provided by the collection of semiconductor elements.

Further in accordance with an embodiment of the present invention, the selective fusing step of the above method is applied to individual integrated circuits rather than to a plurality of such circuits all formed on a single silicon wafer.

The individual integrated circuits are sometimes referred to as dies which are later packaged as complete integrated circuit devices for assembly onto printed circuit boards.

BRIEF DESCRIPTION OF THE DRAWINGS

The present invention will be understood and appreciated more fully from the following detailed description taken in conjunction with the drawings in which:

FIG. 1A is a general illustration of one type of an integrated circuit of conventional design to which the invention may be applied;

FIG. 1B is a more detailed illustration of the physical layout of a portion of the circuit of the type illustrated in FIG. 1A.

FIG. 5 is a block diagram illustration of apparatus for use in customizing integrated circuits.

DETAILED DESCRIPTION OF A PREFERRED EMBODIMENT

Reference is now made to FIG. 1A which illustrates in physical layout format a typical CMOS gate array circuit of the type to which the invention may be applied. The CMOS gate array is used as an example for the purposes of illustration herein. The invention is equally applicable to other types of gate arrays such as, for example, ECL and TTL and to the various designs of gate arrays of these types and others made by various manufacturers. The invention is also applicable to integrated circuits in general other than gate arrays.

The circuit illustrated in FIG. 1A includes an array 10 of semiconductor elements which may be interconnected by a suitable metal layer (not shown) to define the electrical function of the circuit. According to the present invention, fusible links are provided between the semiconductor elements in a manner which enables the functions to be selected by the user.

FIG. 1B illustrates a portion of the circuitry of FIG. 1A. The basic structure is as follows: A first plurality of gates 20 arranged on the integrated circuit is separated from a second plurality of power lines 30, here identified as VDD and VSS, arranged as part of the metal layer of the integrated circuit by sections 40 of layered semi-conductor material such as doped silicon. The interconnections between the various conductors define the electronic function provided by the integrated circuit.

More specifically each junction across the semiconductor material defines a semiconductor element in its most basic form. A combination of these junctions may define a cell and a plurality of such combinations may define an electronic function equivalent to a plurality of cells.

The illustration of FIG. 1B does not illustrate the interconnections between the semiconductor elements. Those interconnections are provided in accordance with the present invention, as illustrated in FIG. 2.

Figure 2:
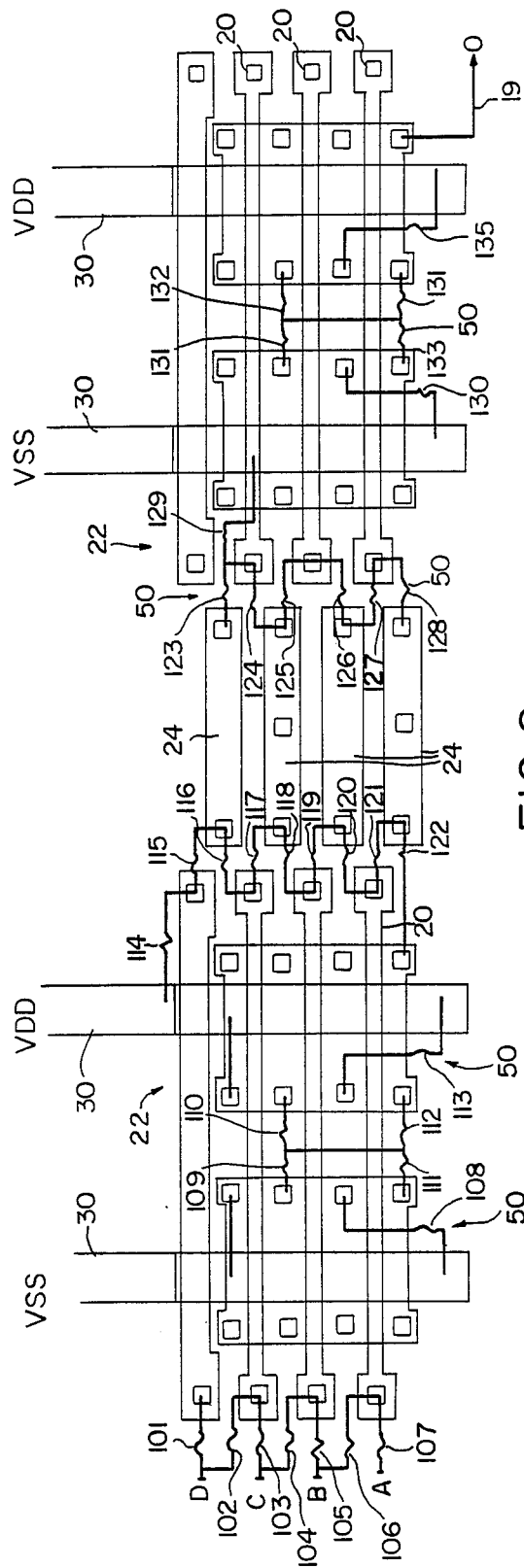
FIG. 2 is a detailed illustration of a portion of a layout shown in FIG. 1B, illustrating fusible interconnections between individual semiconductor elements and between functional groups of areas defining gates.

FIG. 2 illustrates a portion of the gate array of FIG. 1B onto which interconnections have been made in accordance with the present invention. As noted above, the interconnections are made by the metal interconnections layer formed, normally, as the one before the last layer during the fabrication of the integrated circuit. This, however, need not be the case.

Turning to FIG. 2, and adopting the reference numerals already used in connection with FIG. 1B, it is seen that gates 20 and groups 22 of gates 20 are interconnected directly or through underpasses 24, by means of a multiplicity of fusible links 50. Fusible links 50 also interconnect gates 20 with power lines 30. According to a preferred embodiment of the present invention, the fusible links 50 provide a plurality of alternative interconnections between the various gates and power lines, such that until some of the fusible links are fused, the gate array is not practically useful.

It is emphasized that the invention is not limited to any particular pattern of fusible link interconnections between conductors.

Further in accordance with a preferred embodiment of the present invention, the fusible links are not arranged such that they can be fused by means of providing electrical current through the external connections of the integrated circuit. No such electrical connections are provided for that purpose. Thus fusible links 50 are adapted for fusing by application of energy locally to the links themselves or to the vicinity thereof. Obviating the need for electrical connections for fusing greatly simplifies the design and increases the circuit carrying capacity of integrated circuits.

The fusible links 50 illustrated in FIG. 2 have a number of different functions. They may serve as "substructure" links which join semiconductor elements so as to define functions of individual logic gates. Alternatively or additionally they may serve as "interconnection" links, which serve to join individual cells in a predetermined order to provide a desired multiple cell function. FIG. 2 shows a circuit having inputs A,B,C, and D and an output O.

The effect of fusing selected fusible links will now be considered with reference to FIGS. 3A–3C and 4A–4C. To aid in this consideration, the individual fusible links illustrated in FIG. 2 will be identified by numbers beginning with 101.

Figure 3A:
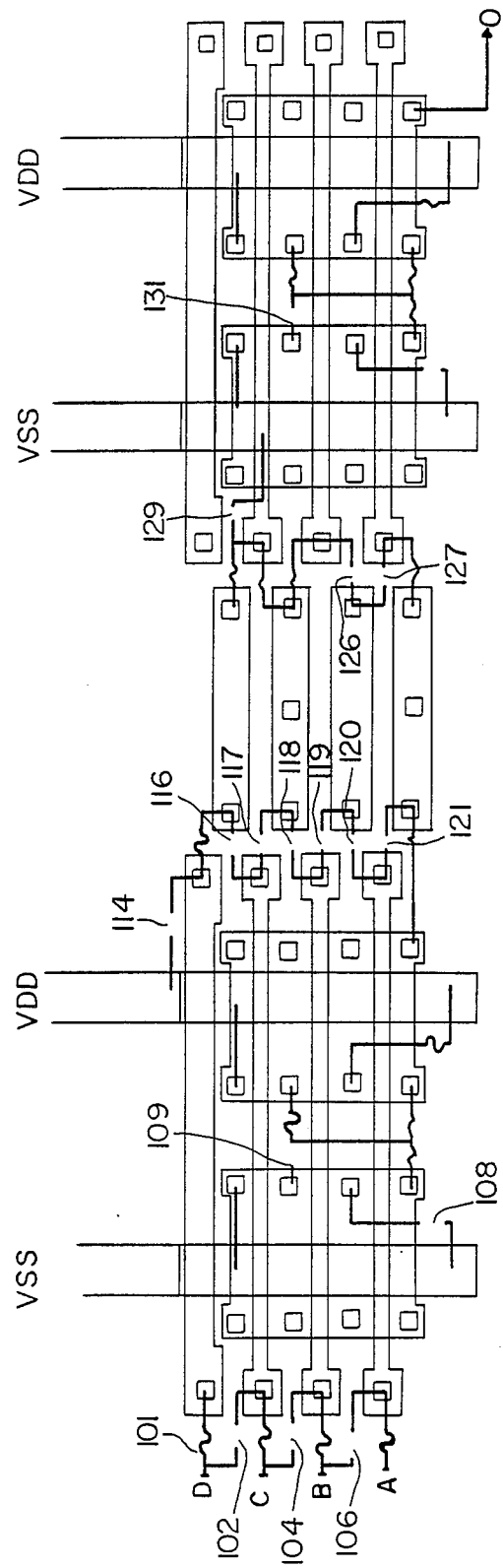
FIGS. 3A, 3B and 3C are illustrations of the part of the integrated circuit shown in FIG. 2, wherein selected ones of the fusible interconnections have been fused, in three different configurations.

In FIG. 3A, the following links are fused: 102, 104, 106, 108, 109, 114, 116, 117, 118, 119, 120, 121, 126, 127, 129 and 131. The remaining links remain intact.

Figure 4A:
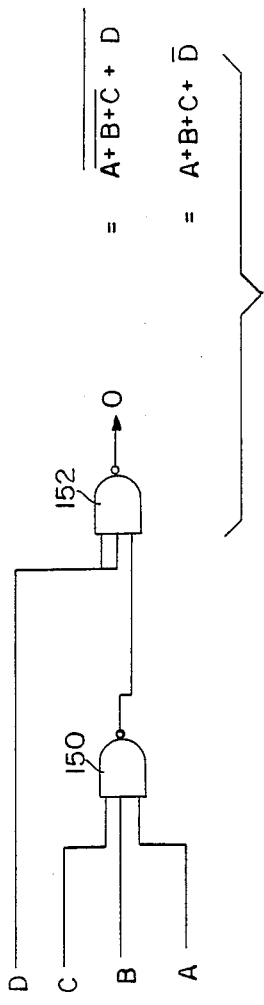
FIGS. 4A, 4B and 4C are illustrations of the electrical equivalent circuits to the circuits of FIGS. 3A, 3B and 3C respectively.

FIG. 4A illustrates the resulting equivalent logic circuit which includes a NAND gate 150 operating on inputs A, B and C and a second NAND gate 152 operating on the output from NAND gate 150 as well as input D. The output 0 from NAND gate 152 is the logic fuction: $\overline{A \cdot B \cdot C} + \overline{D}$.

Figure 3B:
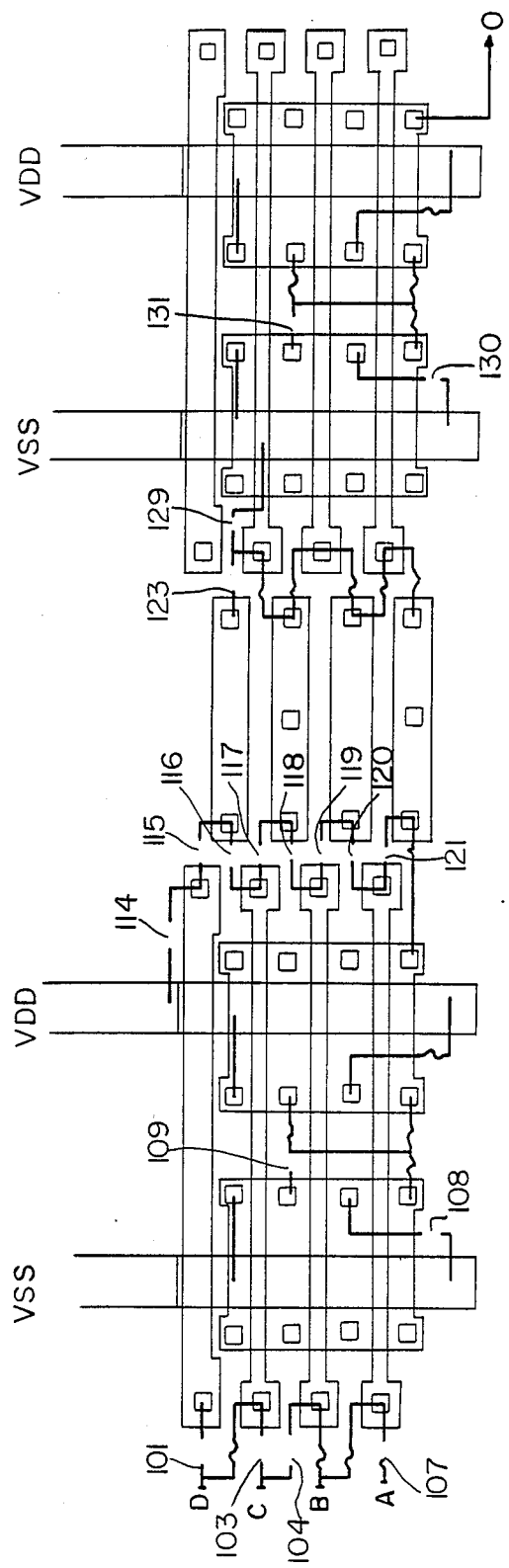

In FIG. 3B, the following links are fused: 101, 103, 104, 107, 108, 109, 114, 115, 116, 117, 118, 119, 120, 121, 123, 129, 130 and 131. The remaining links remain intact.

Figure 4B:
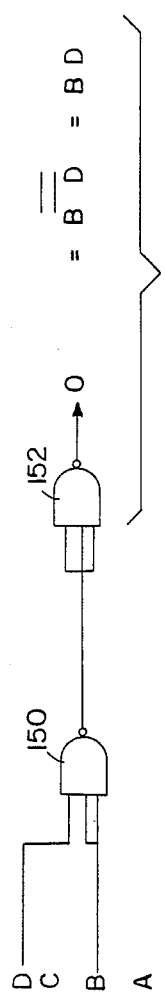

FIG. 4B illustrates the resulting equivalent logic circuit which includes a NAND gate 150 operating on inputs B and D and a second NAND gate 152 operating on the output from NAND gate 150. The output 0 from NAND gate 152 is the logic function: $\overline{B \cdot D}$.

Figure 3C:
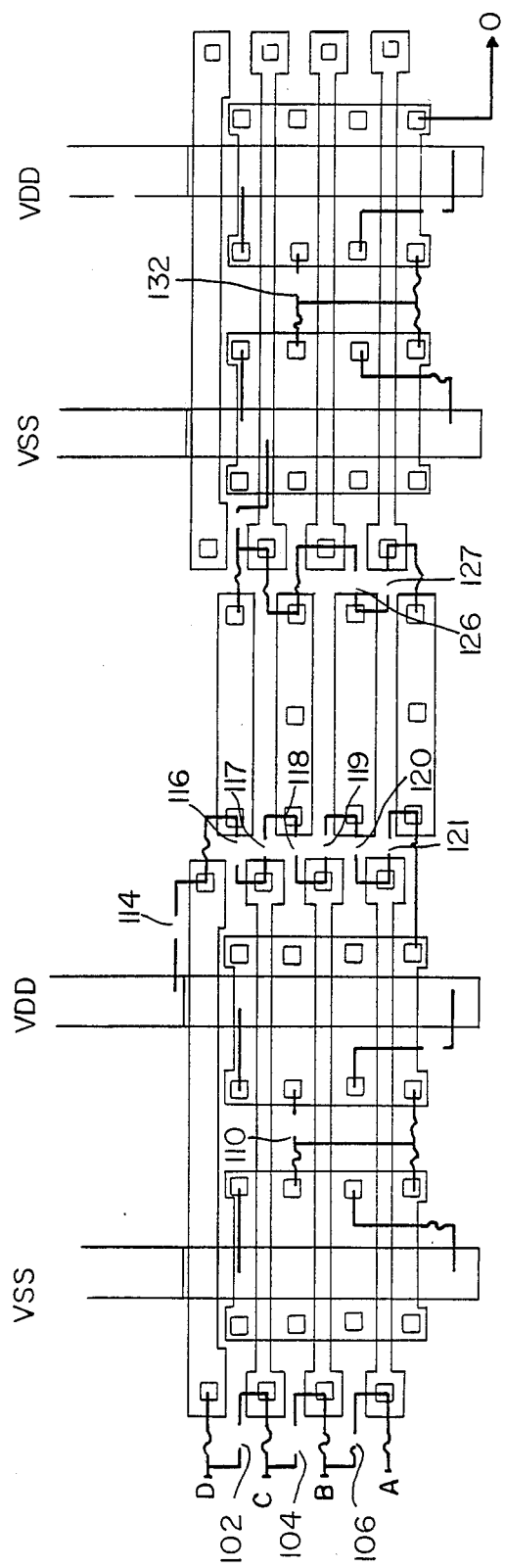

In FIG. 3C, the following links are fused: 102, 104, 106, 110, 114, 116, 117, 118, 119, 120, 121, 126, 127 and 132. The remaining links remain intact.

Figure 4C:
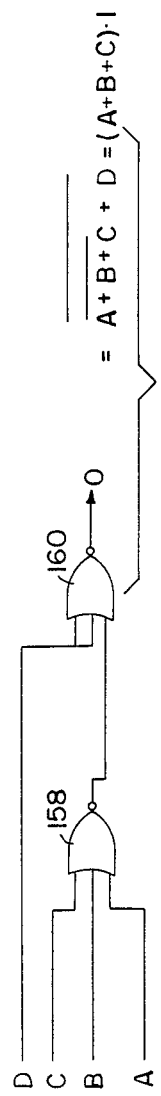

FIG. 4C illustrates the resulting equivalent logic circuit which includes a NOR gate 158 operating on inputs A, B and C and a second NOR gate 160 operating on the output from NOR gate 158 and input D. The output 0 from NOR gate 160 is the logic function: $\overline{(A+B+C) \cdot \overline{D}}$.

From the above examples it may be appreciated that the following fusible links may be considered as "substructure links": 108,109,110,111,112,113,130,131,132,133 and 134.

Likewise, the following fusible links may be considered as "interconnection" links: 101,102,103,104,105,106,107,114, 115, 116,117,118,119,120,121,122,123,124,125,126,127,128, and 129.

It is possible, of course, for fusible links to have both functions. The process of integrated circuit fabrication in accordance with the present invention is summarized as follows: The steps include providing a conventional gate array or any other integrated circuit without an interconnection layer and providing interconnections between the various elements in the gate array including multiple fusible connections. The above steps are normally carried out by the manufacturer of the integrated circuit in accordance with the present invention.

The integrated circuit is then supplied to the customer, such as a manufacturer of electronic equipment. In the form supplied, the integrated circuit is normally not usable for any usual commercial function.

The customer then fuses selected fusible links on the individual integrated circuits to define a particular desired electronic function. According to a preferred embodiment of the invention, the fusing step is carried out by operation directly on the fusible link by a source of fusing energy. Once the appropriate links have been fused, as aforesaid, and the integrated circuit has been tested appropriately, it is ready for incorporation into a prototype electronic system.

Apparatus for carrying out the fusing step is illustrated in block diagram form in FIG. 5. The apparatus is based on a conventional laser cutter 200 such as that manufactured by Florod Corporation of Hawthorne, California, U.S.A.

A dedicated workstation 202 is preferably but not necessarily provided for input of desired design and operation data and may include logic simulator apparatus 204, circuit verification apparatus 206, as well as automatic placement and routing apparatus 208 and 210 respectively for determinig the cutting pattern design.

The workstation 202 communicates with various input and output elements, such as a graphics terminal and tape or disk storage apparatus, not shown and also communicates with a host computer 212, such as a PDP-11/23. The host computer receives the cutting pattern design from the workstation and provides control commands to the laser cutter 200 and positioning apparatus 214. A position verifier circuit 216 provides confirmation of correct positioning and cutting. Additional testing and cut program recording apparatus 218 and 220 is also provided. The information recorded in apparatus 220 may be used for direct mass production of integrated circuits including a metal layer having the desired interconnection links.

It will be appreciated by persons skilled in the art that the invention can be carried out using the conventional Florod laser cutter or equivalent available apparatus together with conventional available computer technology without the special purpose apparatus described in FIG. 5.

It will be appreciated by persons skilled in the art that the present invention is not limited to what has been particularly shown and described hereinabove. Rather the scope of the present invention is defined only by the claims which follow.

I claim:
1. A CMOS gate array device comprising:
   a substrate;
   a collection of individual semiconductor elements formed on the substrate;
   fusible links interconnecting the collection of individual semiconductor elements into an inoperably connected CMOS gate array device; and
   said collection of semiconductor elements being interconnected for converting the inoperable CMOS gate array device into a selected operable elec- tronic function upon the fusing of predetermined ones of the fusible links.

2. A CMOS gate array device according to claim 1 wherein said collection of semiconductor elements are comprised of transistors, and the substrate is comprised of silicon.

3. A CMOS gate array device according to claim 1 wherein said fusible links comprise a first plurality of connection links operative to provide a plurality of connections between individual semiconductor elements to define functional groupings thereof, and a second plurality of connection links operative to provide a plurality of connections between the functional groupings.

4. A CMOS gate array device according to claim 2 wherein said fusible links comprise a first plurality of connection links operative to provide a plurality of connections between individual semiconductor elements to define functional groupings thereof, and a second plurality of connection links operative to provide a plurality of connections between the functional groupings.

5. A CMOS gate array device according to claim 3 wherein said functional groupings define individual cells.

6. A CMOS gate array device according to claim 4 wherein said functional groupings define individual cells.

7. A CMOS gate array device according to claim 3 wherein both the first and second pluralities of connection links are fusible for defining the operable function of the integrated circuit upon the fusing of the predetermined connection links.

8. A CMOS gate array device according to claim 5 wherein both the first and second pluralities of connection links are fusible for defining the operable function of the integrated circuit upon the fusing of the predetermined connection links.

9. A CMOS gate array device according to claim 1 wherein said fusible links are arranged for fusing in response to the direct application of separating means from an external fusing apparatus.

10. A CMOS gate array device according to claim 2 wherein said fusible links are arranged for fusing in response to the direct application of separating means from an external fusing apparatus.

11. A CMOS gate array device according to claim 9 wherein said separating means is laser radiation directed at the fusible links and from an external laser cutter apparatus.

12. A CMOS gate array device according to claim 1 wherein said fusible links interconnect the collection of semi-conductor elements for fusing in a plurality of alternative arrangements.

13. A CMOS gate array device comprising:
a substrate;
a collection of cells mounted on the substrate having input/output pins for operating the CMOS gate array device; and
a plurality of fusible links connecting the cells into an inoperable circuit device, said plurality of fusible links being without electrical fusing connections capable of fusing by electrical current supplied through the input/output pins of the circuit, said collection of cells being interconnected for converting the inoperable circuit device into an operable circuit device upon fusing of predetermined ones of said plurality of links.

14. A CMOS gate array device according to claim 1 wherein the semiconductor elements have input/output pins and wherein the fusible links are without electrical fusing connections capable of fusing by electrical current supplied through the input/output pins of the integrating circuit.

15. An integrated circuit device according to claim 1 and wherein the device is in the form of a die.

16. A CMOS gate array according to claim 3 wherein the functional groupings define collections of cells.

17. A CMOS gate array according to claim 4 wherein the functional groupings define collections of cells.

* * * * *